United States Patent [19]

Perkins

[11] Patent Number: 4,760,353
[45] Date of Patent: Jul. 26, 1988

[54] INTEGRATED GYRATOR OSCILLATOR

[75] Inventor: Geoffrey W. Perkins, Chandler, Ariz.

[73] Assignee: Motorola, Inc., Schaumburg, Ill.

[21] Appl. No.: 140,376

[22] Filed: Jan. 4, 1988

[51] Int. Cl.$^4$ .................................................. H03B 5/00
[52] U.S. Cl. ..................................... 331/132; 331/115; 331/177 R; 333/215
[58] Field of Search .................... 331/108 C, 115, 132, 331/176, 177 R; 333/215

[56] References Cited

U.S. PATENT DOCUMENTS 3,967,210 6/1976 Aumann ........................... 331/132 X Primary Examiner—Eugene R. LaRoche
Assistant Examiner—David Mis
Attorney, Agent, or Firm—Michael D. Bingham

[57] ABSTRACT

An oscillator is disclosed comprising a pair of gm stages wherein the output of the second gm stage is coupled to the inverting input of the first stage and the output of the latter is coupled to the non-inverting input of the former; first and second capacitors coupled respectively between the outputs of the two gm stages and ground and feedback circuitry coupled between the output of the first gm stage and the non-inverting input of thereof while the inverting input of the second gm stage being coupled to ground. Because the first gm stage is operated as a negative gm, this stage simulates an inductor using the first capacitor that is coupled to the output of the stage.

1 Claim, 2 Drawing Sheets

INTEGRATED GYRATOR OSCILLATOR

BACKGROUND OF THE INVENTION

The present invention relates to oscillators and, more particularly, to an integrated oscillator circuit comprising a directional phase changer element.

Since inductive elements can not be readily integrated many prior art integrated oscillator circuits are of the relaxation type in which an external capacitor is charged or discharged through a resistor. Other types of integrated oscillators utilize external frequency determining means such as a crystal for setting the frequency of oscillation. Both of the aforementioned oscillators generally are limited in the range of oscillation and are not suited to be tuned over a broad oscillation band.

Hence, a need exists for an integrated oscillator circuit in which the capacitive elements thereof that are utilized in conjunction with other elements to set the frequency of oscillation, can be integrated on chip with all other elements of the oscillator. Further, it is desirable to be able to control the operating frequency of the oscillator over a broad range.

SUMMARY OF THE INVENTION

Accordingly, it is an object of the present invention to provide an improved integrated oscillator circuit.

It is another object of the invention to provide an improved gyrator integrated oscillator.

Still another object of the invention is to provide an oscillator having a temperature compensated gm stage connected as a gyrator.

In accordance with the above and other objects there is provided an integrated gyrator oscillator comprising a pair of gm stages wherein the output of the second gm stage is coupled to the inverting input of the first stage and the output of the latter is coupled to the non-inverting input of the former; first and second capacitors coupled respectively between the outputs of the two gm stages and ground and feedback circuitry coupled between the output of the first gm stage and the non-inverting input of thereof; and the inverting input of the second gm stage being coupled to ground.

DETAILED DESCRIPTION OF THE PREFERRED EMBODIMENT

Figure 1:
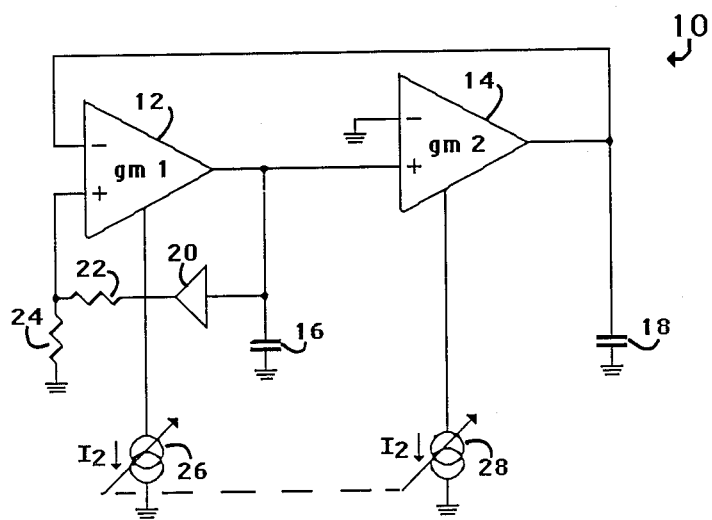
FIG. 1 is partial block and schematic diagram illustrating the gyrator oscillator of the present invention.

Turning to FIG. 1 there is shown integrated gyrator oscillator 10 of the present invention. Oscillator 10 comprises first and second gm stages 12 and 14 each having inverting and non-inverting inputs and an output. The output of gm stage 12 is coupled to the non-inverting input of gm stage 14 while the output of the latter is coupled to the inverting input of the former. A pair of integrated capacitors 16 and 18 are coupled to the respective outputs of gm stages 12 and 14. Feed back circuitry including unity gain buffer amplifier 20, resistors 22 and 24 provide a feedback signal from the output to the non-inverting input of gm stage 12 while the inverting input of gm stage 14 is coupled to ground reference. As will be explained later, the frequency of oscillation of gyrator oscillator 10 is controlled by an external current source shown schematically by current sources 26 and 28 which control gm stages 12 and 14 respectively.

Figure 2:
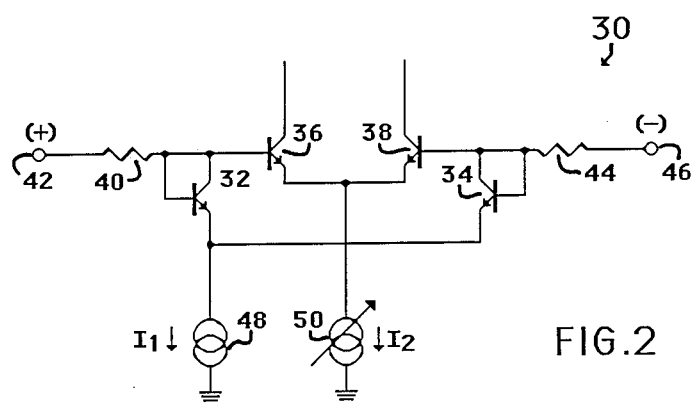
FIG. 2 is a schematic diagram of a prior art current gain cell.

Each of the gm stages 12 and 14 are comprised of a well known wide band amplifier or current cell illustrated in FIG. 2. A detailed analysis of the operation of amplifier 30 is described in the *IEEE JOURNAL OF SOLID-STATE CIRCUITS*, published December 1968, pp 353–365. Briefly, amplifier 30 includes a pair of diode-connected transistors 32 and 34 coupled to respective inputs of a differential amplifier comprising transistors 36 and 38. The base of transistor 36 is coupled to the non-inverting input 42 of the gm stage via resistor 40 while the base of transistor 38 is coupled to the inverting input 46 via resistor 44. The emitter or cathode of diode means 32 is coupled in common with the emitter or cathode of diode means 34 to a constant current supply 48 which sinks a current $I_1$. The commonly connected emitters of transistors 36 and 38 are coupled to a second current supply 50 for providing the tail current $I_2$. Current supply 50 may be controlled for varying the magnitude of the current $I_2$ which, in turn, varies the gm of the stage.

As described in detail in the aforementioned IEEE Journal, the gain or transconductance of the gm stage is equal to:

$$gm = \frac{1}{2R} \cdot \frac{I_2}{I_1} \tag{1}$$

Hence, the gm of the stage may be varied by changing the controlled current $I_2$. It can be shown that if gm 1 equals gm 2, and C1 equals C2 (where C1 and C2 are the respective capacitances of capacitors 16 and 18) that the frequency of oscillation of gyrator oscillator 10 is:

$$f_{osc} = \frac{1}{2\frac{1}{gm}C} \tag{2}$$

inserting the value for gm into equation 2 as defined by equation 1 shows that the frequency of oscillation is directly proportional to the value of current $I_2$. Thus, by controlling $I_2$ the frequency of gyrator oscillator 10 may be varied over a broad range.

By coupling the output of gm stage 14 to the inverting input of gm stage 12 the latter operates as a negative stage such that the output thereof simulates an inductive element to sustain oscillations at the frequency, $f_{osc}$.

Because gyrator oscillator 10 is an integrated circuit the gm stages 12 and 14 will have a temperature coefficient (TC) equal to the TC of the integrated resistors of the oscillator. However, if $I_1$ is made inversely proportional to the value of an internal integrated resistor and $I_2$ is an externally controlled current supply and has a zero TC, then the gm of the oscillator will be constant with temperature.

Figure 3:
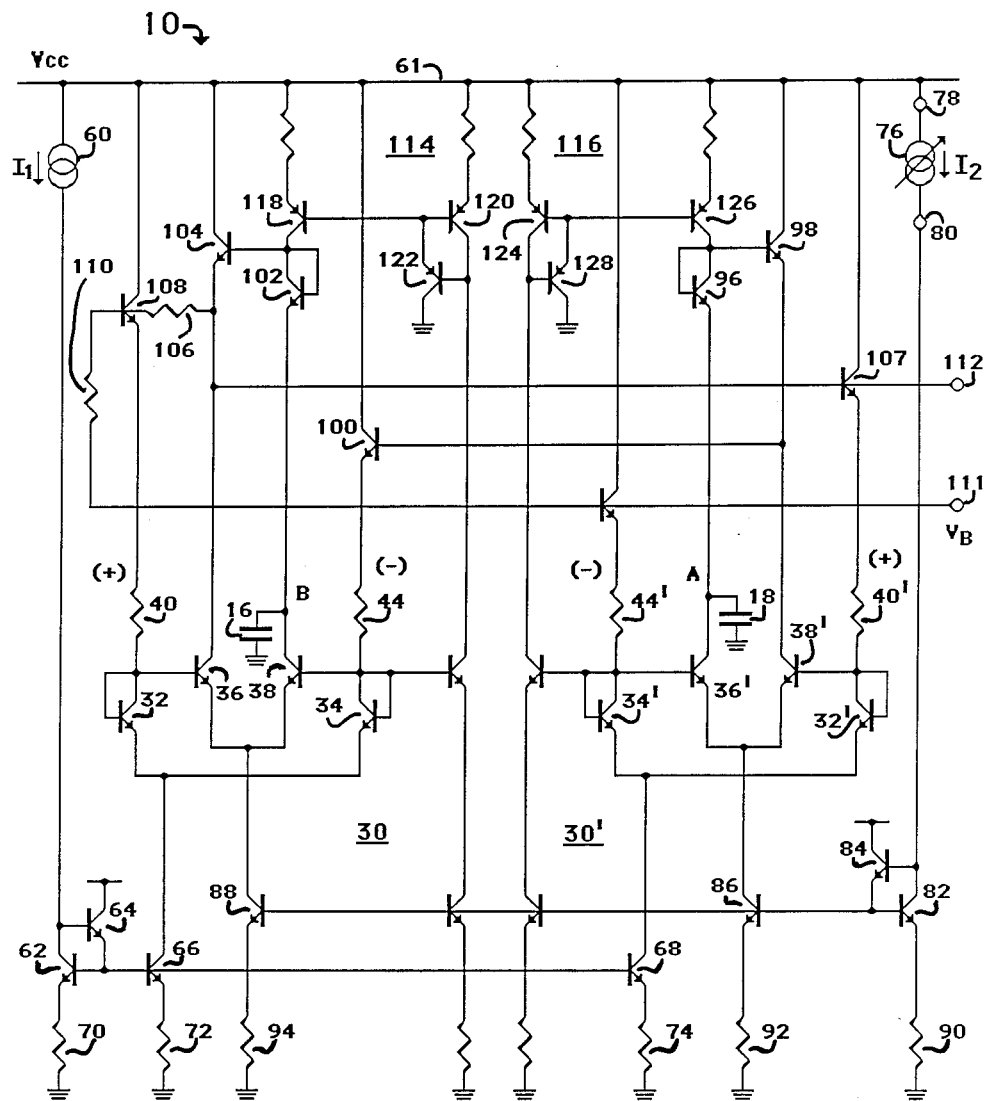
FIG. 3 is a detailed schematic of the oscillator of FIG. 1.

Turning now to FIG. 3, there is illustrated integrated gyrator oscillator 10 of the preferred embodiment in greater detail. It is understood that components of FIG. 3 corresponding to like components of FIGS. 1 and 2 are designated by the same reference numbers. Further it is also understood that certain resistors and transistors are not specifically called out in the description of FIG.

3 as these components are conventional in operation for providing biasing.

Transconductance stages 12 and 14 are illustrated as including current gain cells 30 and 30' described above with reference to FIG. 2. The current $I_1$ is supplied from current supply 48 to diode means 32 and 34 of gm stages 12 and 14 via the current mirror arrangement comprising transistors 62, 64, 66 and 68 and resistors 70, 72 and 74. Transistor 62 in conjunction with transistor 64 is functionally operated as a diode such that transistors 66 and 68, which have their respective base couple to the base of transistor 62 are biased to conduct a current equal to $I_1$ from the respective diodes 32, 34 and 32', 34'. Similarly, current source 76, which in the preferred embodiment is an external controlled current supply, coupled to terminals 78 and 80 provides the current $I_2$ which is mirrored through transistors 82 and 84 and respective resistor 90 to source the currents $I_2$ and $I_2'$ from the differential amplifiers comprising transistors 36, 38 and 36', 38' through transistors 86 and 88 and resistors 92 and 94. The output of gm stage 14 is taken at node A and is voltage shifted through diode connected transistor 96 and supplied via transistor 98 to the base of buffer transistor 100 to drive the inverting input of gm stage 12 through resistor 44. The output of gm stage 12 is taken at node B and is coupled to the non-inverting input of gm stage 14 via voltage shifting diode connected transistor 102, transistor 104 and buffer transistor 107, the latter of which has its emitter coupled to resistor 40'. A portion of the output signal from gm stage 12 is fedback through resistor 106 and transistor 108 to the non-inverting input of the gm stage at the resistor 40. A bias potential $V_B$ is supplied to the base of transistor 108 from input terminal 111 via resistor 110. The output of oscillator 10 may be provided at output 112 which is connected to the emitter of transistor 104. A pair of current sources 114 and 116 provide bias current to the cells 30 and 30'. Current source 114 includes transistors 118, 120 and 124 along with associated resistors such that the current flowing through transistor 120 is mirrored to produce a current flow equal approximately to one-half $I_2$ through transistor 118 as is understood. Similarly, the current flow though transistor 124, which is operated as a diode by the connection of transistor 128 therewith, is mirrored to produce a current flow through transistor 126 equal to one-half $I_2$.

The operation of oscillator 10 is as aforedescribed wherein gm stage 12 operates as a negative gm stage such that this first stage simulates an inductor using capacitor 16 which in conjunction with capacitor 18 of the second gm stage 14 provides the tank circuit for the oscillator. By controlling current source 76, the currents $I_2$ and $I_2'$ are varied to control the frequency of the oscillator.

By using a gm stage that operates as a negative gm to simulate an inductor allows the integration of two capacitors on chip with the integrated gyrator oscillator. Further, the use of two wide band amplifiers or current gain cells permits the output frequency of the oscillator to be tuned over a wide range.

What is claimed is:
1. An oscillator, comprising:
a first current source for supplying a controlled current;
a first transconductance stage being operated to provide a negative transconductance and having an inverting input, a non-inverting input, a control input, and an output, said control input being coupled to said first current source;
first capacitive means coupled to said output of said first transconductance stage;
a second transconductance stage having an inverting input, a non-inverting input, a control input, and an output, said control input being coupled to said first current source, said output being coupled to said inverting input of said first transconductance stage, said non-inverting input being coupled to said output of said first transconductance stage and said inverting input being coupled to ground potential;
a second capacitive means coupled to said output of said second transconductance stage; and
feedback circuit means for providing a feedback signal from said output of said first transconductance stage to said non-inverting input thereof.

* * * * *

UNITED STATES PATENT AND TRADEMARK OFFICE
CERTIFICATE OF CORRECTION

PATENT NO. : 4,760,353

DATED : July 26, 1988

INVENTOR(S) : Geoffrey W. Perkins

It is certified that error appears in the above-identified patent and that said Letters Patent is hereby corrected as shown below:

Column 2, line 43, in the equation for $f_{osc}$, after "2" insert -- $\pi$ --.

Signed and Sealed this

Thirty-first Day of October, 1989

Attest:

DONALD J. QUIGG

Attesting Officer

Commissioner of Patents and Trademarks